United States Patent
Park et al.

(10) Patent No.: US 11,695,097 B2
(45) Date of Patent: Jul. 4, 2023

(54) LIGHT-EMITTING DEVICE

(71) Applicant: UNIVERSITY-INDUSTRY FOUNDATION (UIF), YONSEI UNIVERSITY, Seoul (KR)

(72) Inventors: Cheolmin Park, Seoul (KR); Woo Kyoung Jin, Seoul (KR); Eui Hyuk Kim, Seoul (KR)

(73) Assignee: UNIVERSITY-INDUSTRY FOUNDATION (UIF), YONSEI UNIVERSITY, Seoul (KR)

( * ) Notice: Subject to any disclaimer, the term of this patent is extended or adjusted under 35 U.S.C. 154(b) by 401 days.

(21) Appl. No.: 17/104,182

(22) Filed: Nov. 25, 2020

(65) Prior Publication Data
US 2021/0159439 A1    May 27, 2021

(51) Int. Cl.
*H05B 33/20* (2006.01)
*H01L 33/38* (2010.01)
*H05B 33/26* (2006.01)
*H01L 33/50* (2010.01)

(52) U.S. Cl.
CPC .......... *H01L 33/385* (2013.01); *H05B 33/20* (2013.01); *H05B 33/26* (2013.01); *H01L 33/502* (2013.01)

(58) Field of Classification Search
CPC ........ H05B 33/20; H05B 33/26; H01L 33/385
USPC ....................................................... 345/156
See application file for complete search history.

(56) References Cited

U.S. PATENT DOCUMENTS

2021/0183940 A1*   6/2021   van der Sijde ....... H01L 27/156

FOREIGN PATENT DOCUMENTS

| KR | 10-2008-0101250 | 11/2008 |
|---|---|---|
| KR | 10-2017-0136667 | 12/2017 |
| KR | 10-2018-0069990 | 6/2018 |

OTHER PUBLICATIONS

Office Action dated Nov. 19, 2020 corresponding to Korean Application No. 10-2019-0153752, 4 pages.

* cited by examiner

*Primary Examiner* — Christopher M Raabe

(57) ABSTRACT

A light-emitting device according to the present invention comprises, an electrode unit including a first electrode and a second electrode spaced apart from each other, with electrical signals having different polarity applying the first and second electrode, respectively; a first stimulation unit disposed on one surface of the electrode unit and having a first stimulation reaction layer expressing variable luminance according to a first stimulation; and a second stimulation unit disposed on the other surface facing the one surface of the electrode unit, and having a second stimulation reaction layer expressing a variable luminance according to a second stimulation different from the first stimulation.

20 Claims, 10 Drawing Sheets

A-A'

LIGHT-EMITTING DEVICE

CROSS-REFERENCE TO RELATED APPLICATION

This application claims priority of Korean Patent Application No. 10-2019-0153752, filed on Nov. 26, 2019, in the KIPO (Korean Intellectual Property Office), the disclosure of which is incorporated herein entirely by reference.

BACKGROUND OF THE INVENTION

Field of the Invention

The present invention relates to a light-emitting device, and more particularly, to a light-emitting device of a visible light variable type.

Description of the Related Art

Recently, as demand for wearable devices as well as portable electronic devices of smart phones and tablets has exploded, the demand for smart displays and sensors has increased. In particular, the technology for directly visualizing various stimuli has been spotlighted as a future technology capable of overcoming the limitations of human cognitive ability in extreme situations, and is also spotlighted as an alternative technology capable of overcoming human cognitive impairment. As such, the visualization technology of human cognitive sensory information such as auditory sense and touch sense is applied to smart displays and sensors, and thus, is applied not only to wearable devices, but also to a wide range of fields such as next-generation portable and vehicle displays, advertising smart windows, and media facade replacement technologies. Furthermore, it may be applied to technologies in the field of robots or artificial intelligence that have overcome the limitations of human sensory capabilities.

On the other hand, conventional research on displays and sensors that sense and display external stimuli is a principle of observing changes in luminance intensity depending on changes in the external stimuli, and also requires equipment and processes capable of measuring luminance intensity. In addition, the conventional technology has a function capable of detecting various stimuli from a single device, but has a limitation in that it is not possible to specifically identify what kind of stimulation.

SUMMARY OF THE INVENTION

A technical problem to be solved by the present invention is to provide a light-emitting device of visible light variable type that detects and displays external stimuli.

Another technical problem to be solved by the present invention is to provide a light-emitting device capable of visualizing stimulation without additional equipment for observing the stimulation when sensing and displaying an external stimulation.

Another technical problem to be solved by the present invention is to provide a light-emitting device capable of detecting a plurality of stimuli from one device and visually distinguishing what kind of stimulation.

A light-emitting device according to one example of the present invention comprises, an electrode unit including a first electrode and a second electrode spaced apart from each other, with electrical signals having different polarity applying the first and second electrode, respectively; a first stimulation unit disposed on one surface of the electrode unit and having a first stimulation reaction layer expressing variable luminance according to a first stimulation; and a second stimulation unit disposed on the other surface facing the one surface of the electrode unit, and having a second stimulation reaction layer expressing a variable luminance according to a second stimulation different from the first stimulation.

In the light-emitting device according to one example of the present invention, an AC electrical signal is input to the electrode unit.

In the light-emitting device according to one example of the present invention, the first electrode and the second electrode are disposed on the same plane.

In the light-emitting device according to one example of the present invention, the first stimulation reaction layer and the second stimulation reaction layer include electroluminescence phosphor particles that express different colors.

In the light-emitting device according to one example of the present invention, electroluminescence phosphor particles in the first and second stimulation reaction layers are ZnS-based nanoparticles, and the electroluminescence phosphor particles are dispersed in a polymer matrix layer.

In the light-emitting device according to one example of the present invention, the polymer matrix layer is PDMS (polydimethylsiloxane).

In the light-emitting device according to one example of the present invention, the first stimulation is pressure, the first stimulation reaction layer senses the intensity of the pressure, the second stimulation is temperature, and the second stimulation reaction layer senses the resistance change according to the temperature change.

In the light-emitting device according to one example of the present invention, the intensity of the pressure and the change in resistance may be continuously detected.

In the light-emitting device according to one example of the present invention, the first stimulation portion further includes a first stimulation application layer facing the first stimulation reaction layer.

In the light-emitting device according to one example of the present invention, the first stimulation application layer includes a conductive polymer layer, and the conductive polymer layer may contact the first stimulation reaction layer.

In the light-emitting device according to one example of the present invention, the conductive polymer layer includes a polymer consisting of PEDOT:PSS ((poly(3,4-ethylenedioxythiophene):poly(styrene sulfonate)).

In the light-emitting device according to one example of the present invention, the conductive polymer layer is not electrically connected to an external circuit.

In the light-emitting device according to one example of the present invention, the surface of the conductive polymer layer capable of contacting the first stimulation reaction layer includes a plurality of dome shapes.

In the light-emitting device according to one example of the present invention, the first stimulation application layer further includes a polymer substrate in contact with the conductive polymer layer.

In the light-emitting device according to one example of the present invention, the second stimulation unit further includes a polymer electrolyte layer on the bottom surface of the second stimulation reaction layer.

In the light-emitting device according to one example of the present invention, a resistance of the polymer electrolyte layer is changed according to temperature.

In the light-emitting device according to one example of the present invention, the polymer electrolyte layer includes a polymer composite including polyethylene oxide (PEO), lithium trifluoromethanesulfonylimide (LiTFSI), and polyethylene glycol dimethyl ether (PEGDME).

In the light-emitting device according to one example of the present invention, the polymer electrolyte layer is in the form of a gel.

In the light-emitting device according to one example of the present invention, at least a portion of the first stimulation reaction layer and at least a portion of the second stimulation reaction layer are disposed between the first electrode and the second electrode.

In the light-emitting device according to one example of the present invention, the first electrode and the second electrode include a polymer consisting of PEDOT:PSS ((poly(3,4-ethylenedioxythiophene):poly(styrene sulfonate)).

According to a light-emitting device according to one example of the present invention, since a change in the visible light wavelength band may be directly observed through the light-emitting device, there is no need to provide a separate device for measuring the stimulation intensity.

According to a light-emitting device according to one example of the present invention, it is possible to detect a plurality of stimuli, and at the same time, it is possible to distinguish specific types of stimuli by including separate light emitting cell structures configured to react only to every stimulation.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
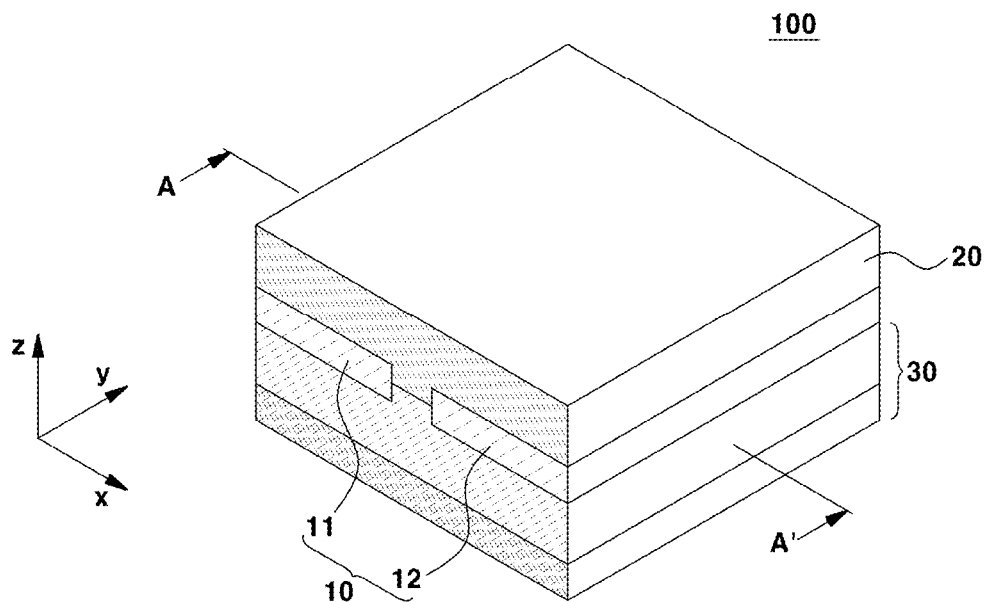
FIG. 1 is a schematic perspective diagram of a light-emitting device of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Figure 2:
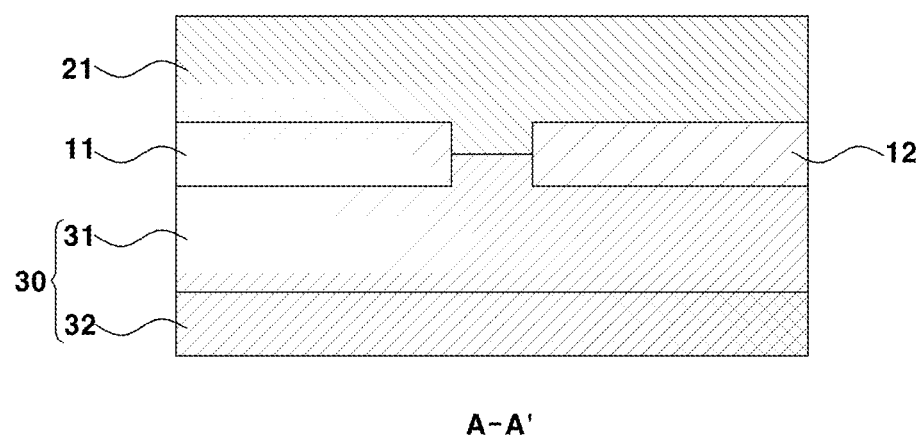
FIG. 2 is a cross-sectional diagram taken along line I-I' of FIG. 1.

FIG. 1 is a perspective diagram showing a light-emitting device 100 according to an embodiment of the present invention, and FIG. 2 is a cross-sectional diagram of the light-emitting device of FIG. 1 taken along line A-A'. The light-emitting device 100 according to an example of the present invention detects different stimuli as one device and is a light-emitting device of a visible light wavelength band variable type according to the change.

Referring to FIGS. 1 and 2, the light-emitting device 100 may comprise an electrode unit 10 including a first electrode 11 to apply a signal having a polarity and a second electrode 12 spaced apart from the first electrode to apply a signal having a polarity different from that of the first electrode; a first stimulation unit 20 including a first stimulation reaction layer disposed on one surface of the electrode unit 10 and varying a luminance according to a first stimulation; and second stimulation unit 30 including a second stimulation reaction layer disposed on the other surface facing the one surface of the electrode unit and varying a luminance according to a second stimulation different from the first stimulation.

The electrode unit 10 including the first electrode 11 and the second electrode 12 may receive an AC electric signal, and when an AC electric signal is input to the electrode unit, fluorescent colors different from each other are expressed in the first stimulation reaction layer and the second stimulation reaction layer of the light-emitting device 100.

The first electrode 11 and the second electrode 12 may be arranged on the same plane as a non-limiting example, and in this specification, the same plane means that one surface of the first electrode and one surface of the second electrode are configured at the same position on any one of the x-axis, y-axis, and z-axis constituting the light-emitting device. As shown in FIG. 1 and FIG. 2, one surface of the first electrode and one surface of the second electrode are positioned at the same height level with respect to the z-axis. The first and the second electrodes 11 and 12 may be, for example, a conductive polymer layer of PEDOT:PSS, or an indium tin oxide (ITO) oxide that is a transparent electrode as a non-limiting example.

A first stimulation unit 20 may be disposed on one surface of the electrode unit 10, and a second stimulation unit 30 may be disposed on the other surface facing the one surface of the electrode unit 10. In this case, the first stimulation unit 20 and the second stimulation unit 30 operate independently from each other, and, for example, the stimulation detection of the second stimulation unit cannot be affected by the stimulation detection of the first stimulation unit.

Figure 3:
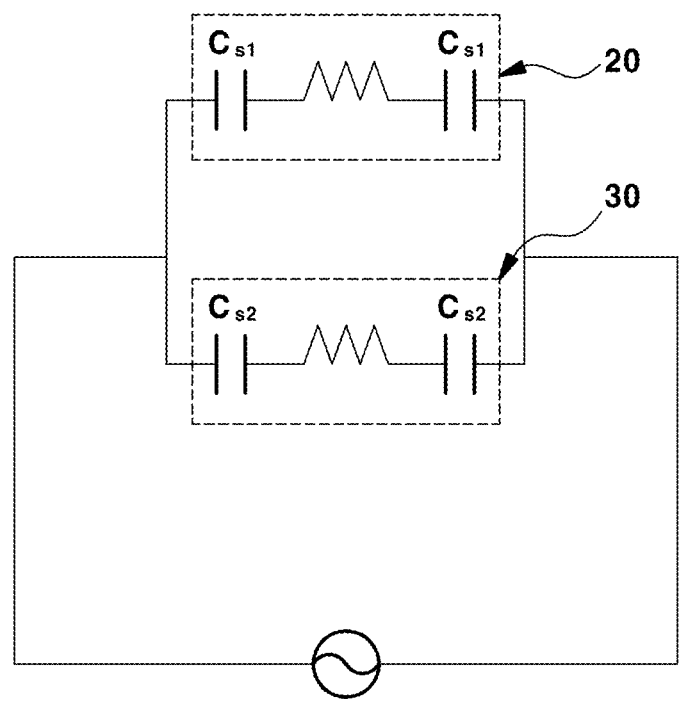
FIG. 3 is a schematic circuit diagram for operating the light-emitting device of the present invention.

FIG. 3 shows a simple circuit diagram of the light-emitting device of one example of the present invention.

Referring to FIG. 3, while the first stimulation unit 20 and the second stimulation unit 30 share an electrode unit, the circuit of the first stimulation unit 20 and the circuit of the second stimulation unit 30 are connected in parallel to each other.

With respect to the first stimulation unit 20, the first stimulation unit 20 is a stimulation unit capable of sensing pressure as a non-limiting example, and the luminance of the first stimulation unit 20 varies in the visible light region depending on the intensity of the pressure. Luminance in this specification is the amount of light in a specific direction, that is, the amount of light that passes through a certain area and enters a certain three-dimensional angle, and an unit of the luminance may be expressed in candelas ($Cd/m^2$) or nits per area.

Referring again to FIG. 2 together with the FIG. 3, the first stimulation unit 20 includes a first stimulation reaction layer 21 that can observe the change in luminance according to the change in the intensity of a stimulation. The first stimulation reaction layer 21 includes electroluminescence phosphor particles therein, and the electroluminescence phosphor particles may be applied without limitation as long as they are particles capable of realizing fluorescence in the visible region. As a non-limiting example, the electroluminescence phosphor particles may have a ZnS nanoparticle doped with copper metal. In one example, the size of the electroluminescence phosphor particles may range from 1 µm to 100 µm, as a non-limiting example, and more preferably, from 20 µm to 70 µm. When the size is a nano-scale smaller than 1 µm, it is possible that the luminous performance may be deteriorated to an extent insufficient to visually confirm the luminous intensity, and when it is larger than 100 µm, the luminance intensity may be strong, but since a larger voltage is required to be applied, there may be restrictions on applications such as a wearable device. When the electroluminescence phosphor particles are in a more preferable size range, it is advantageous because it is possible to express remarkable fluorescence in the visible light region even at a low voltage.

In one example, the electroluminescence phosphor particles in the first stimulation reaction layer 21 may be Cu—ZnS nanoparticles which exhibit an orange color at a 10 kHz alternating voltage. However, the fluorescent color of the nanoparticles may be appropriately set according to the fabrication requirement or the required physical properties.

When the pressure applied to the first stimulation reaction layer is varied, the luminance intensity of orange light emitted from Cu—ZnS nanoparticles changes according to the pressure intensity.

The first stimulation reaction layer 21 may further include a polydimethylsiloxane (PDMS) polymer as a matrix in which the electroluminescence phosphor particles are dispersed. However, the example is not limited thereto, and may include one or more selected from polydimethylsiloxane (PDMS), polybutadiene (PB), polyurethane (PU), polyurethaneacrylate (PUA), styrene-butadiene rubber (SBR), polyvinylidene fluoride (PVDF) and poly(vinylidenefluoride-co-trifluoroethylene) (PVDF-co-TrFE). Since the PDMS polymer has the properties of an elastic polymer, it may be stably adhered to an uneven surface, and there is a tendency that even if the PDMS is molded with another polymer, an adhesion does not occur since interfacial free energy is low. In addition, the PDMS polymer is specifically proper for the light-emitting device that senses a change in external stimulation, since the PDMS may maintain transparency even to a thickness of about 300 nm optically.

The electroluminescence phosphor particles of the first stimulation reaction layer 21 may sense an electrical signal according to the occurrence and change of the stimulation, and the luminance of the electroluminescence phosphor particles inside the first stimulation reaction layer according to the intensity of the electrical signal (luminance) may change. Thus, it is possible to visually observe the type and/or intensity of the stimulation through a change in luminance of the light-emitting device according to the present invention.

Figure 4A:
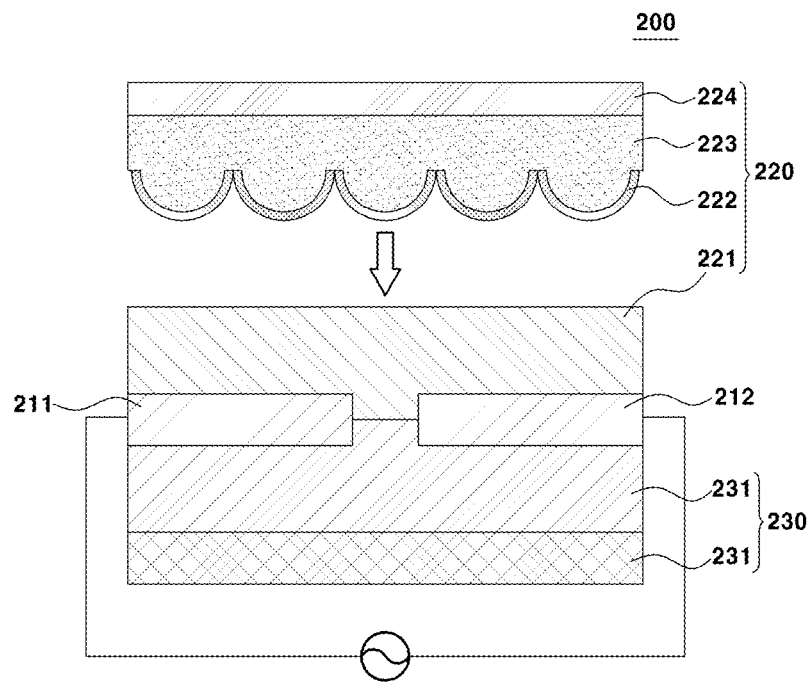
FIGS. 4A and 4B are specific cross-sectional diagrams of a light-emitting device according to the first and second embodiments.
Figure 4B:
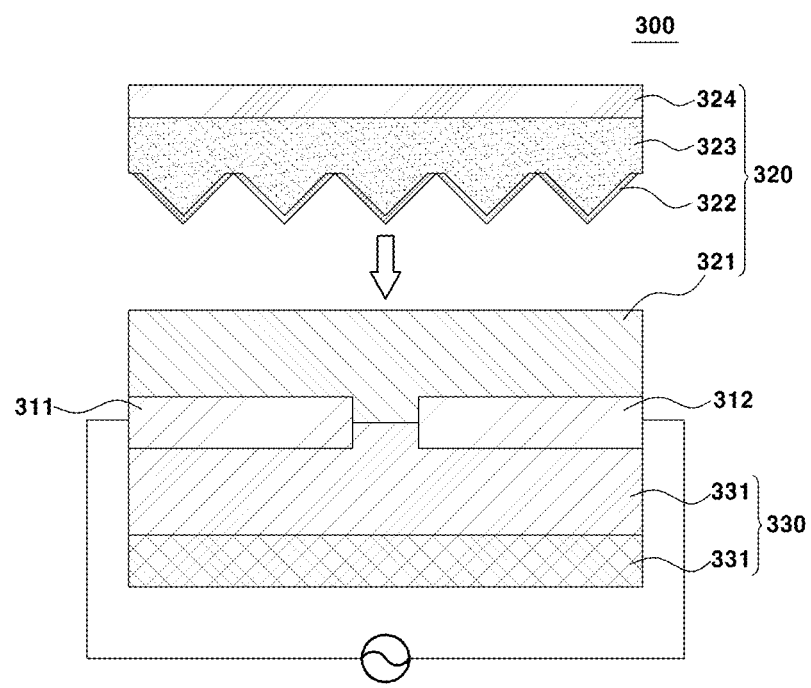

FIG. 4A and FIG. 4B are cross-sectional diagrams of a light-emitting device further including a first stimulation application layer 222 and 322 in the light-emitting device of the present invention shown in FIGS. 1 and 2. In FIG. 4A and FIG. 4B, the first stimulation application layers 222 and 322 have different shapes from each other. Specifically, the first stimulation unit 220 of the light-emitting device 200 illustrated in FIG. 4A further includes the first stimulation application layer 222 having at least dome-shaped protrusions, and the first stimulation unit 320 of the light-emitting device 300 shown in FIG. 4B further includes a first stimulation application layer 322 having at least a pyramid-shaped protrusion.

Referring to FIG. 4A and FIG. 4B, in the first stimulation units 220 and 320, the first stimulation reaction layers 221 and 321 of the first stimulation units are disposed to connect the first and the second electrodes 211 and 212; 311 and 312. The position at which the first stimulation unit 220, 320 may be disposed to connect the first and second electrodes may be selected without limitation as long as the first stimulation unit 220 and 320 and the first and second electrodes 211 and 212; 311 and 312 can be connected to each other as a circuit format.

The first stimulation unit 220 and 320 may be, as a non-limiting example, composed of a material including a PDMS polymer matrix which is an elastic body and fluorescent nanoparticles, and more specifically, may be composed of the PDMS polymer matrix and fluorescent nanoparticles dispersed in the PDMS polymer matrix. The fluorescent nanoparticles may have a structure where ZnS-based particles are doped with copper, but are not limited thereto.

Referring again to FIG. 4A, and FIG. 4B, the first stimulation application layers 222 and 322 included in the first stimulation units 220 and 320 may include a conductive polymer layer. The first stimulation application layer may be composed of a single layer of a conductive polymer layer, or may be composed of a plurality of layers including a conductive polymer layer 222, 322 as illustrated in FIGS. 4A and 4B. The conductive polymer layer 222, 322 may be applied without limitation as long as it is a conductive material, and for example, it may be composed of a high-conductivity polymer material such as PEDOT:PSS, but the conductive materials may be selected by a person skilled in the art in consideration of required characteristics and fabrication conditions. In addition, the conductive polymer layers 222 and 322 may be made of an ITO material that is not a polymer material, but has transparent properties and excellent electrical conductivity, and detailed description thereof will be omitted.

The conductive polymer layers 222 and 322 included in the first stimulation application layer 222, 322 may not be electrically connected to an external circuit, and the structure wherein the conductive polymer layers 222 and 322 may be not electrically connected to an external circuit means the conductive polymer layer 222 and 322 may be a structure in which an electrical signal is applied only by contact with the first stimulation layers 221 and 321, and an electrical signal is not input from a separate external circuit. In addition, the conductive polymer layers 222 and 322 may further include polymer substrates 223 and 323 to support the conductive polymer layers 222 and 322, and as a non-limiting example, the material of the polymer substrate may be PDMS polymer. Since the polymer substrates 223 and 323 serve to support the conductive polymer layers 222 and 322, it is preferable that the conductive polymer layer 222, 322 may be configured to contact at least one surface with the polymer substrate 223, 323. In addition, optionally further include a PET film thin film 224, 324 may be provided in contact with the polymer substrate 223, 323 to protect and support the polymer substrate 223, 323, and the polymer substrate 223, 323 may be a flexible substrate including one or more from selected PE (polyethylene), PP (polypropylene), PDMS (polydimethylsiloxane), PVDF (polyvinylidene fluoride), PES (polyethersulfone), PS (polystyrene), PC (polycarbonate), PI (polyimide), PEN (polyethylene naphthalate) and PAR (polyarylate), in addition to PET.

On the other hand, the conductive polymer layer 222, 322 may have a structure including a plurality of protrusions on a surface of the conductive polymer layer 222, 322, as shown in FIG. 4A and FIG. 4B. FIG. 4A illustrates that the protrusion of the conductive polymer layer 222 has a structure of a dome shape, and FIG. 4B illustrated that the protrusion of the conductive polymer layer 322 has a pyramid shape. Here, the structure having a plurality of domes may mean a structure in which the surfaces of the plurality of protrusions have a curved or semicircular shape. When the conductive polymer layers 222 and 322 have a protrusion structure, it is possible to more sensitively and precisely detect a change in an external pressure intensity applied on the first stimulation unit 220 and 320, as compared to a flat structure without such a protrusion structure. Specifically, when the pressure is linearly increased or decreased, the protrusions are configured to linearly increase or decrease the contact area between the conductive polymer layers 222 and 322 and the first stimulation reaction layers 221 and 321.

Figure 5:
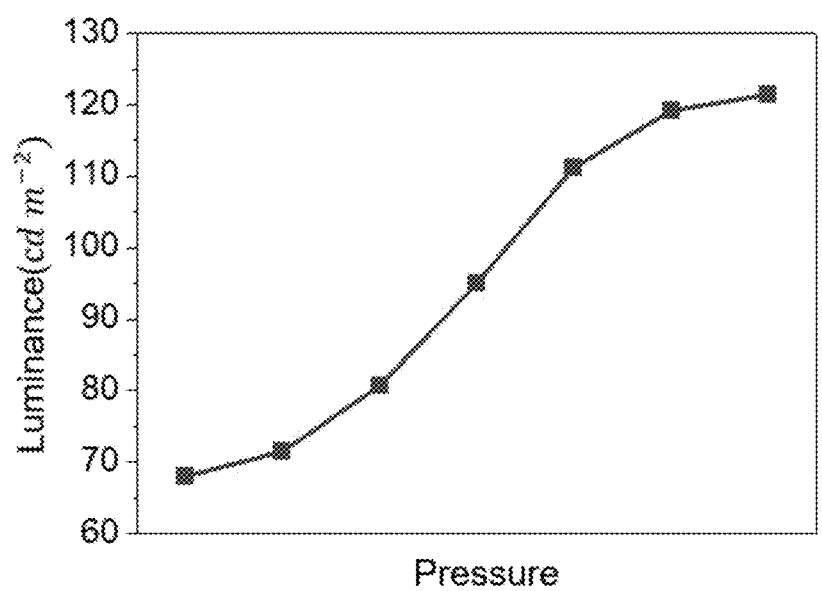
FIG. 5 is a pressure-luminance graph for the light-emitting device according to the first embodiment.

FIG. 5 shows a change in impedance value according to a pressure change in the light-emitting device 200 according to FIG. 4A including a first stimulation application layer including a dome-shaped protrusion. Referring to FIG. 5, the impedance change may be substantially proportional as the intensity of pressure increases. From FIG. 5, it can be seen that the light-emitting device including the protrusion having a dome shape may continuously detect a change in pressure, and the luminance linearly increases according to the continuously detected pressure change.

Figure 6:
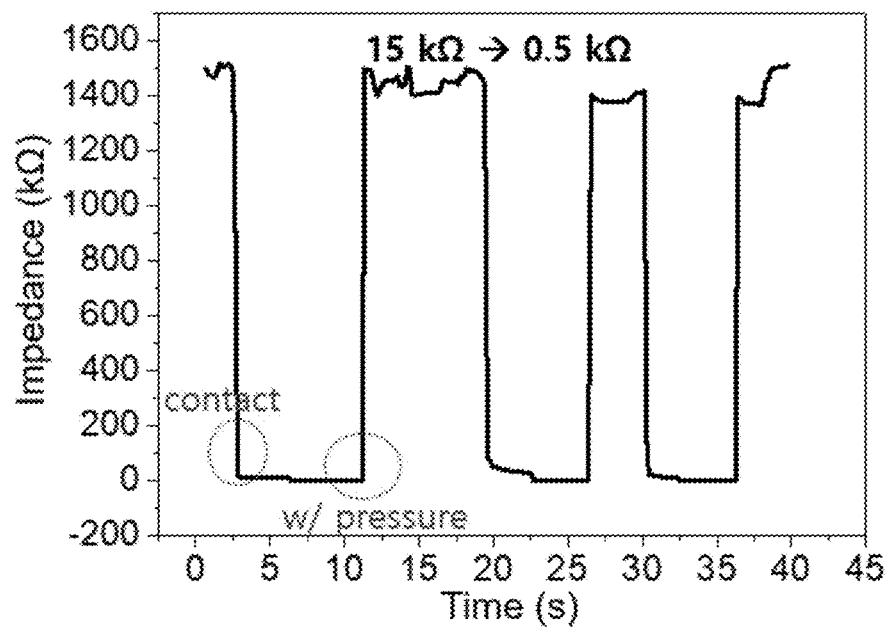
FIG. 6 is a time-impedance graph for the light-emitting device according to the first embodiment.

Next, FIG. 6 is a time-impedance graph for repeating the experiment in which the first stimulation reaction layer 221 and the first stimulation application layers 222, 223, and 224 are brought into contact for a predetermined time, in a structure of the light-emitting device 200 shown in FIG. 4A. Referring to FIG. 6, it can be observed that the impedance resistance value drops to a very low level at the same time when the first stimulation reaction layer and the first stimulation application layer are in contact. In addition, after the impedance resistance value drops to a very low level, if the contact between the first stimulation reaction layer and the first stimulation application layer is maintained, the impedance resistance value is maintained at a low level. Subsequently, when releasing the contact, it can be observed that the impedance resistance value lowered due to the contact rapidly increases to the initial impedance resistance value. In this view, when a pressure change is applied to the light-emitting device of the present invention, the pressure is maintained, and then a pressure change such as removal of pressure is sensed in the light-emitting device, it may be observed that the impedance resistance value behavior of the light-emitting device also changes reliably according to the pressure change, and through such a reliable change, the pressure change may be quickly detected.

Figure 7A:
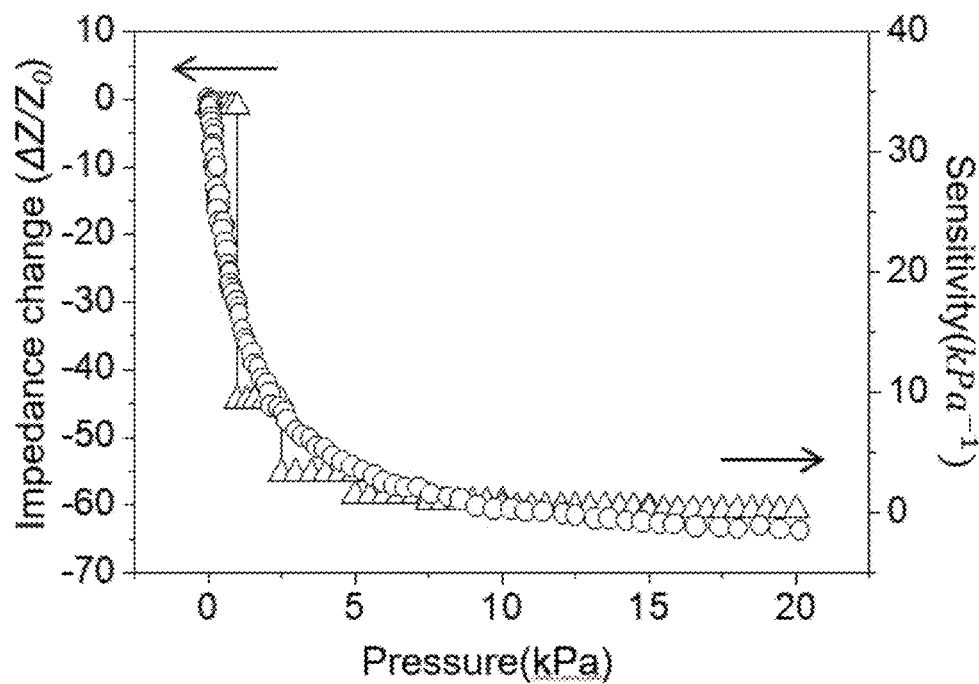
FIG. 7A is a pressure-impedance and pressure-sensitivity graph according to the first embodiment.
Figure 7B:
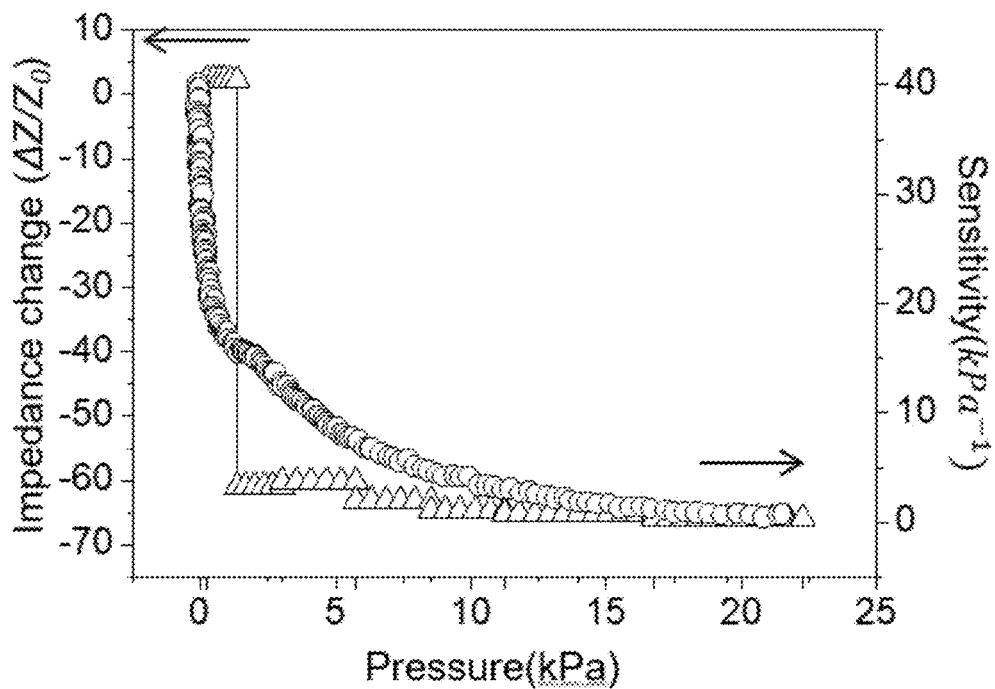
FIG. 7B is a pressure-impedance and pressure-sensitivity graph according to the second embodiment.

Next, FIG. 7A is a graph showing luminance change (circle line) and sensitivity (triangle line) according to pressure applied to the first stimulation reaction layer in the light-emitting device 200 according to the structure of FIG. 4A. FIG. 7B is a graph showing luminance change (circle line) and sensitivity (triangle line) according to pressure applied to the first stimulation reaction layer in the light-emitting device 300 according to the structure of FIG. 4B.

Referring to FIG. 7A and FIG. 7B, it can be observed that in a 525V and 10 kHz circuit condition, the luminance tends to increase substantially linearly with increasing pressure. In addition, since the pressure is going toward a low range, the sensitivity is enhanced. Thus, in particular, it is possible to provide a light-emitting device that is advantageous for visually observing the luminance change according to the pressure intensity change even in the low pressure range.

Figure 8:
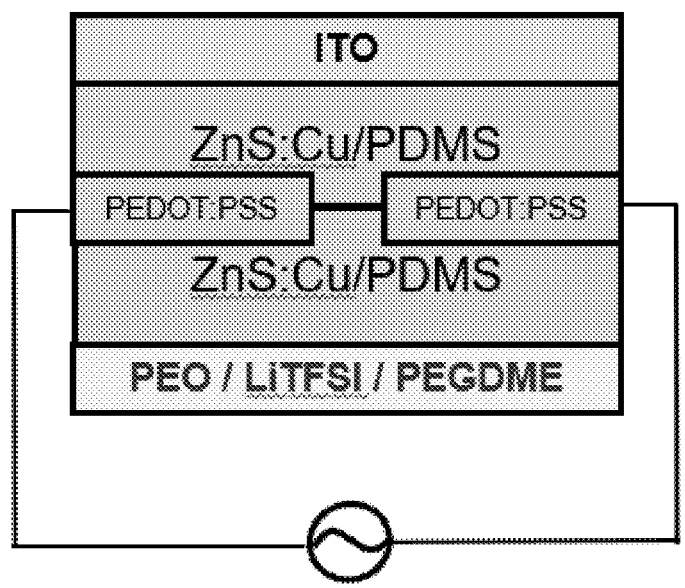
FIG. 8 is a cross-sectional diagram of a light-emitting device according to a first modification example for more specifically describing a mechanism of temperature sensing in the light-emitting device according to the first embodiment.

Next, referring to FIG. 8, the second stimulation unit disposed over the first and second electrodes, and sensing other stimulation of a type different from that of the first stimulation unit will be described in detail. In the light-emitting device of the present invention, since the first stimulation unit may operate independently of the second stimulation unit, it is as described above that different stimuli can be sensed independently in one light-emitting device. As a non-limiting example, the inventive device of the present invention may detect a change in pressure through the first stimulation unit, and detect a change in temperature through the second stimulation unit. FIG. 8 specifically illustrates the material of each component of the light-emitting device of the present invention, however, which is for convenience of explanation of the invention, and the present invention is not limited thereto. In addition, it can be seen that the top surface in FIG. 8 may be coated with an ITO transparent electrode. It is designed to form a closed circuit between the first stimulation unit; and the first and second electrodes, resulting in that a pressure applied to the first stimulation unit does not affect the first stimulation unit, which can describe the reaction mechanism of the second stimulation unit through FIG. 8 in more detail, Specifically, the second stimulation unit may include a second stimulation reaction layer (ZnS:Cu/PDMS), and it is preferable to contain electroluminescence phosphor particles that express a different color from the electroluminescence phosphor particles contained in the first stimulation reaction layer in order to visually observe the fact that the second stimulation reaction layer is different from the stimulation applied to the first stimulation reaction layer of the first stimulation unit. For example, if the electroluminescence phosphor particles of the first stimulation reaction layer are ZnS-based fluorescent nanoparticles that express an orange color series, the electroluminescence phosphor particles of the second stimulation reaction layer may be ZnS-based fluorescent nanoparticles that express a blue color series.

Referring to FIG. 8, the second stimulation unit may include a second stimulation reaction layer (ZnS:Cu/PDMS) disposed commonly over the first and second electrodes (PEDOT:PSS) and a polymer disposed on the bottom surface of the second stimulation reaction layer; and a polymer electrolyte layer disposed on the bottom surface of the second stimulation reaction layer. The second stimulation reaction layer may be configured as a structure in which electroluminescence phosphor particles expressing a color different from that of the first stimulation reaction layer may be dispersed in a PDMS polymer matrix, as described in the first stimulation reaction layer.

In addition, the polymer electrolyte layer may be applied without limitation as long as it is a layer in which electrical resistance may be changed according to an increase in temperature, and may include, as a non-limiting example, polyethylene oxide (PEO) and lithium bis(trifluoromethane-sulfonyl)imide (LIFTSI). In addition, the polymer electrolyte layer may, optionally, further include poly(ethylene glycol) dimethyl ether (PEGDME), and when the polymer electrolyte layer further includes the PEGDME, it is possible to more linearly control the change in resistance due to temperature change. The polymer electrolyte layer, as an embodiment, may include PEO and LIFTSI in a ratio of 15:1 by weight, and as described above, when the polymer electrolyte layer includes PEGDME as well as PEO and LIFSI, it may include PEO of 3 wt %, LIFTSI of ⅟15 weight based on PEO weight, and PEGDME of 5 wt %, but is not limited thereto. The composition and the composition ratio in the polymer electrolyte layer may be appropriately controlled according to characteristics required by those skilled in the art.

As a specific example, the light-emitting device according to an example of the present invention shown in FIG. 8 may include a second stimulation reaction layer including a PDMS polymer matrix and a blue ZnS-based electroluminescence phosphor particle in a ratio of about 1.3:1; and a polymer electrolyte layer containing PEGDME in addition to PEO and LIFSI, but the present invention is not limited thereto. The polymer electrolyte layer may be a gel as a non-limiting example, but it is needless to say that a person skilled in the art may appropriately change the properties of the material according to the required characteristics of the light-emitting device.

Figure 9:
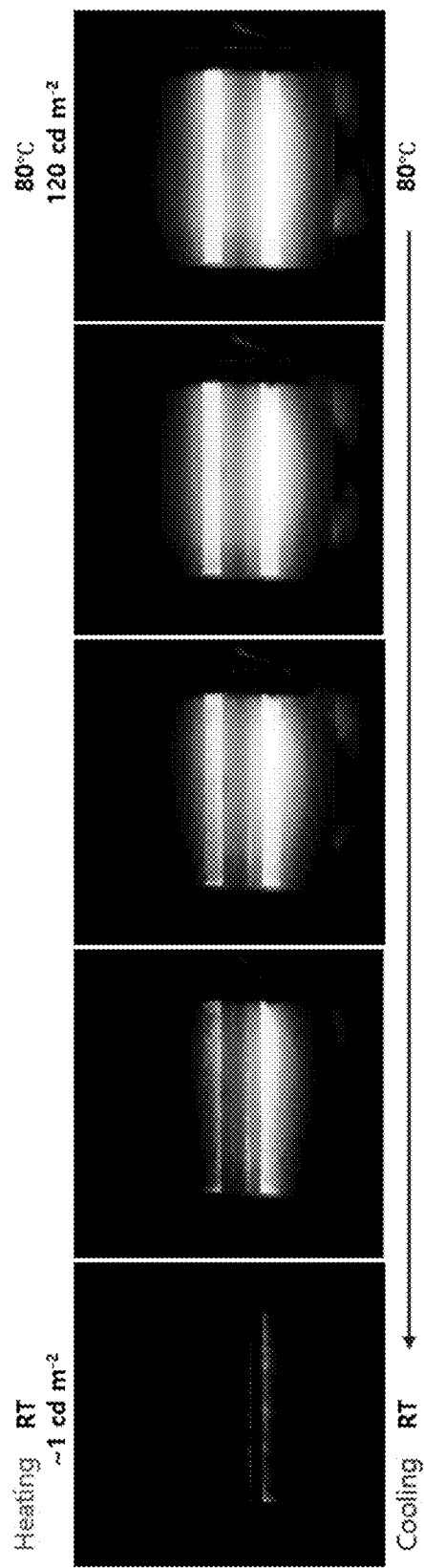
FIG. 9 and FIG. 10 are diagrams showing the color change of the light-emitting device according to the temperature change.

Next, FIG. 9 is a diagram visually showing a change in luminance according to a temperature change in the second stimulation unit of the light-emitting device shown in FIG. 8. Referring to FIG. 9, the light-emitting device of the present invention detects a temperature rise/fall within the temperature range from room temperature to about 80 t in the second stimulation unit, and accordingly, the change in luminance may be visually sensed.

Figure 10:
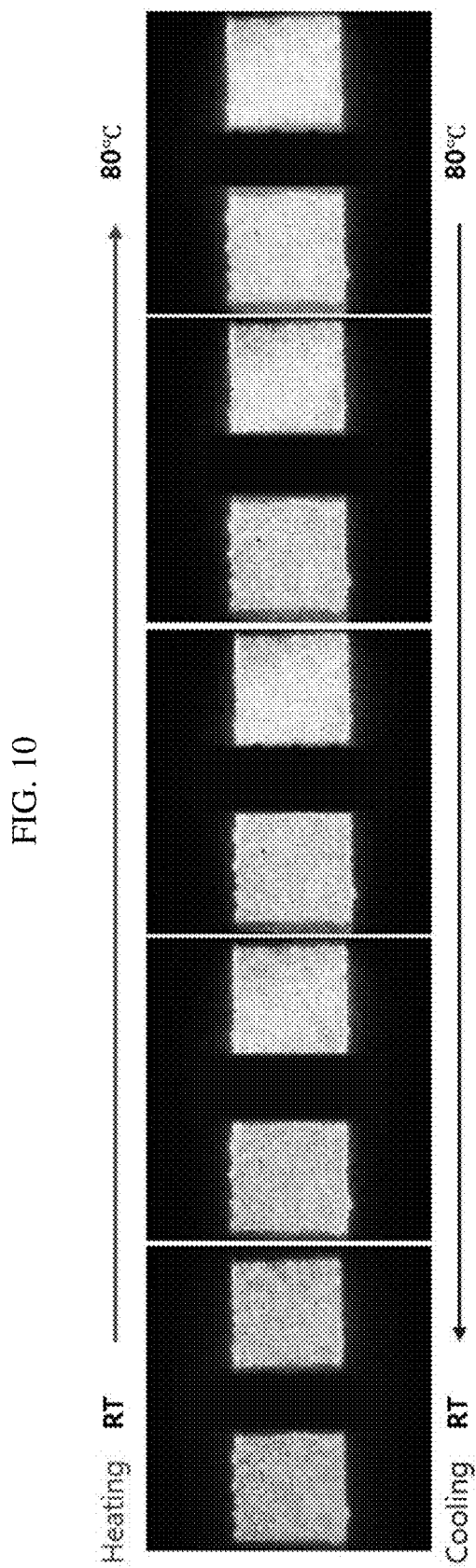

FIG. 10 is different from FIG. 9 in that the color of the electroluminescence phosphor particles contained in the second stimulation reaction layer is yellow, and referring to FIG. 10, the temperature increase/decrease is sensed within a temperature range of room temperature and 80° C. and thus, the change in luminance is measurable at any level that may be visually detected.

As can be seen through FIGS. 9 and 10, the color of the electroluminescence phosphor particles contained in the stimulation reaction layer may be variously selected, for example, the blue color of FIG. 9 or the orange color of FIG. 10. As a method for changing the color of the electroluminescence phosphor particles, as a non-limiting example, a method for changing the type of metal doped on the ZnS-based luminescent particles may be adopted. The main reason of it is as follows. That is, in the case of ZnS-based light-emitting particles, it has a unique emission wavelength band according to the doped metal. For example, in order to realize blue light emission, ZnS light-emitting particles may be doped with copper. In order to emit orange light, ZnS light-emitting particles may be doped with copper or manganese. In this case, the color of the electroluminescence phosphor particles may be diversified by controlling the type of metal doped in the ZnS-based light-emitting particles and the amount of the doped metal.

Figure 11:
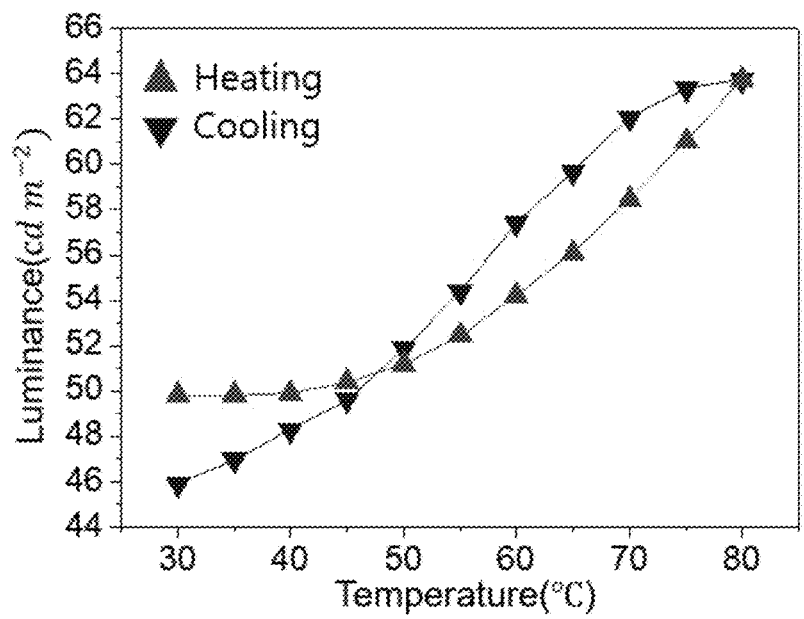
FIG. 11 is a graph showing a change in luminance according to a change in temperature of the light-emitting device shown in FIG. 8.

Meanwhile, FIG. 11 is a graph showing changes in luminance according to an increase/decrease in temperature in the light-emitting device illustrated in FIG. 8. Referring to FIG. 11, when the temperature of the light emitting element increases, the change in luminance increases substantially linearly, and similarly, when the temperature decreases, the change in luminance decreases substantially linearly. Through the graph of FIG. 11, it is understood that the light-emitting device of the present invention may linearly detect the temperature change even under conditions of repeating the temperature rise and fall, and the detected change may be expressed visually through electroluminescence phosphor particles.

Figure 12:
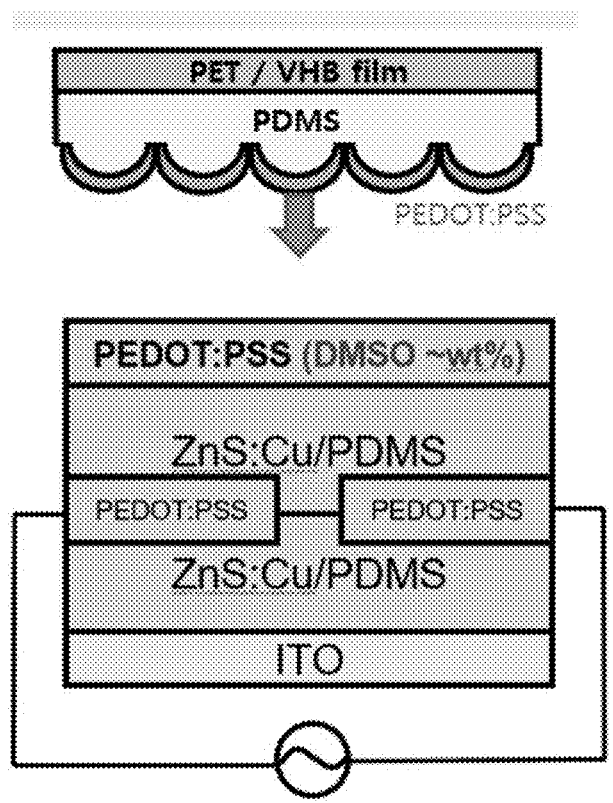
FIG. 12 is a cross-sectional diagram of a light-emitting device according to a second modification for explaining the independence of temperature-pressure sensing in the light-emitting device according to the first embodiment.

Next, FIG. 12 is a cross-sectional diagram of a light-emitting device in which the second stimulation unit is modified to form a closed circuit together with the first and second electrodes, in order to confirm that the first stimulation unit for sensing the pressure change, and the second stimulation unit facing the first stimulation unit may be operated independently of each other in the light-emitting device 200 of the present invention shown in FIG. 4A. Referring to FIG. 12, by replace the polymer electrolyte layer of the second stimulation unit with an ITO transparent electrode, a mechanism for sensing the temperature of the polymer electrolyte layer of the light-emitting device of FIG. 4A and changing the resistance thereof may be omitted.

Figure 13:
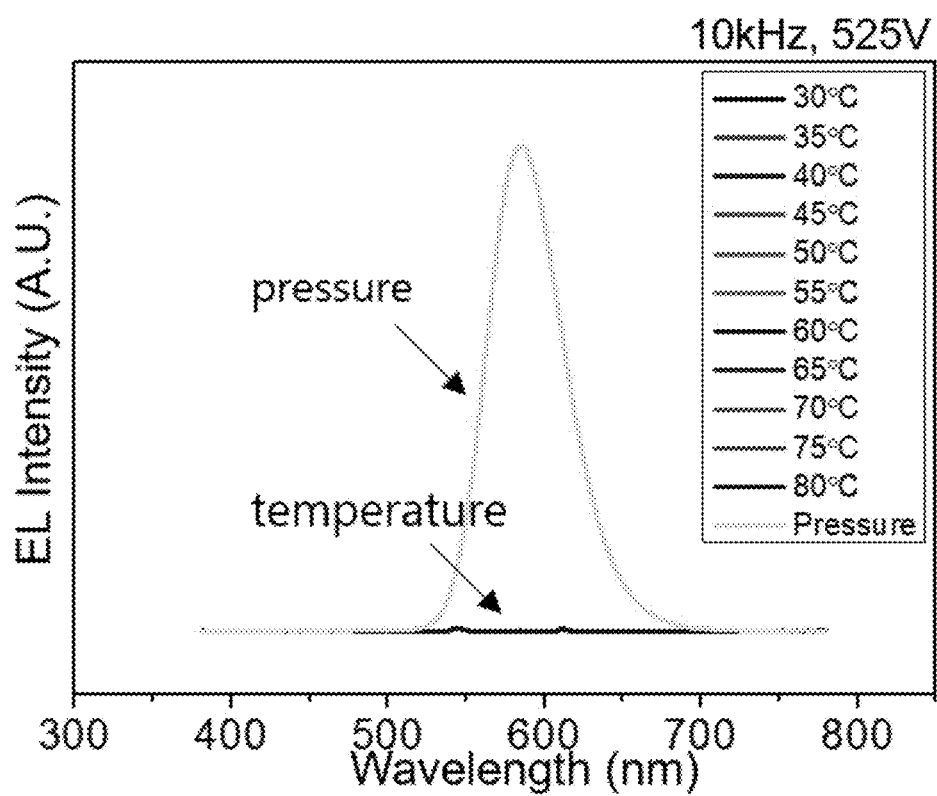
FIG. 13 is a wavelength-EL intensity graph of the light-emitting device shown in FIG. 12.

FIG. 13 is a graph showing a change in EL (electroluminance) intensity according to a wavelength while applying pressure to the light-emitting device of FIG. 12. Referring to FIG. 13, while the emission wavelength band according to pressure is clearly observed, emission does not occur with respect to temperature. Considering the results, it may be confirmed that in the light-emitting device including the first stimulation portion responsive to pressure, and the second stimulation portion responsive to temperature, the first stimulation portion may be driven so as not to be affected by temperature, and the second stimulation portion may be driven so as not to be affected by pressure. In conclusion, referring to FIGS. 12 and 13, it can be seen in the light-emitting device of the present invention that the first stimulation unit sensing the pressure is designed not to be affected by the second stimulation unit sensing temperature, and the first stimulation unit sensing the pressure in the light emitting element and the second stimulation unit sensing the temperature operate independently of each other.

According to the light-emitting device according to the present invention, a plurality of different types of stimuli may be sensed independently from one light-emitting device, and the sensed stimuli may be directly observed through a change in a visible light wavelength range in each stimulation unit. Therefore, in the case of the light-emitting device, the type and intensity of the stimulation sensed from one device may be sensed without additional measurement equipment.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A light-emitting device comprising,
an electrode unit including a first electrode and a second electrode spaced apart from each other, with electrical signals having different polarity applying the first and second electrode, respectively;
a first stimulation unit disposed on one surface of the electrode unit and having a first stimulation reaction layer expressing variable luminance according to a first stimulation; and
a second stimulation unit disposed on the other surface facing the one surface of the electrode unit, and having a second stimulation reaction layer expressing a variable luminance according to a second stimulation different from the first stimulation.

2. The light-emitting device of the claim 1, wherein an AC electrical signal is input to the electrode unit.

3. The light-emitting device of the claim 1, wherein the first electrode and the second electrode are disposed on the same plane.

4. The light-emitting device of the claim 1, wherein the first stimulation reaction layer and the second stimulation reaction layer include electroluminescence phosphor particles that express different colors from each other.

5. The light-emitting device of the claim 1, wherein electroluminescence phosphor particles in the first and second stimulation reaction layers are ZnS-based nanoparticles, and the electroluminescence phosphor particles are dispersed in a polymer matrix layer.

6. The light-emitting device of the claim 5, wherein the polymer matrix layer is PDMS (polydimethylsiloxane).

7. The light-emitting device of the claim 1, wherein the first stimulation is pressure, the first stimulation reaction layer detects an intensity of the pressure, the second stimulation is temperature, and the second stimulation reaction layer detects a resistance change according to the temperature change.

8. The light-emitting device of the claim 7, wherein the intensity of the pressure and the change in resistance may be continuously detected.

9. The light-emitting device of the claim 1, wherein the first stimulation unit further includes a first stimulation application layer facing the first stimulation reaction layer.

10. The light-emitting device of the claim 9, wherein the first stimulation application layer includes a conductive polymer layer, and the conductive polymer layer may contact the first stimulation reaction layer.

11. The light-emitting device of the claim 10, wherein the conductive polymer layer includes a polymer consisting of PEDOT:PSS (poly(3,4-ethylenedioxythiophene):poly(styrene sulfonate)).

12. The light-emitting device of the claim 10, wherein the conductive polymer layer is not electrically connected to an external circuit.

13. The light-emitting device of the claim 10, wherein the surface of the conductive polymer layer capable of contacting the first stimulation reaction layer includes a plurality of dome shapes.

14. The light-emitting device of the claim 10, wherein the first stimulation application layer further includes a polymer substrate in contact with the conductive polymer layer.

15. The light-emitting device of the claim 1, wherein the second stimulation unit further includes a polymer electrolyte layer on the bottom surface of the second stimulation reaction layer.

16. The light-emitting device of the claim 15, wherein a resistance of the polymer electrolyte layer is changed according to temperature.

17. The light-emitting device of the claim 15, wherein the polymer electrolyte layer includes a polymer composite including polyethylene oxide (PEO), lithium trifluoromethanesulfonylimide (LiTFSI), and polyethylene glycol dimethyl ether (PEGDME).

18. The light-emitting device of the claim 15, wherein the polymer electrolyte layer is formed as a gel type.

19. The light-emitting device of the claim 1, wherein at least a portion of the first stimulation reaction layer and at least a portion of the second stimulation reaction layer are disposed between the first electrode and the second electrode.

20. The light-emitting device of the claim 1, wherein the first electrode and the second electrode include a polymer consisting of PEDOT:PSS ((poly(3,4-ethylenedioxythiophene):poly(styrene sulfonate)).

* * * * *